(12) United States Patent
Streubel

(10) Patent No.: US 9,099,574 B2
(45) Date of Patent: Aug. 4, 2015

(54) OPTOELECTRONIC SEMICONDUCTOR CHIP AND METHOD FOR PRODUCING IT

(75) Inventor: Klaus Streubel, Laaber (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1674 days.

(21) Appl. No.: 11/992,844

(22) PCT Filed: Sep. 4, 2006

(86) PCT No.: PCT/DE2006/001549
§ 371 (c)(1),
(2), (4) Date: Mar. 11, 2009

(87) PCT Pub. No.: WO2007/036190
PCT Pub. Date: Apr. 5, 2007

(65) Prior Publication Data
US 2009/0283783 A1    Nov. 19, 2009

(30) Foreign Application Priority Data

Sep. 30, 2005  (DE) .......................... 10 2005 047 157
Dec. 21, 2005  (DE) .......................... 10 2005 061 346

(51) Int. Cl.
*H01L 21/00*    (2006.01)
*H01L 33/00*    (2010.01)
*H01L 33/20*    (2010.01)
*H01L 33/22*    (2010.01)

(52) U.S. Cl.
CPC ............ *H01L 33/0079* (2013.01); *H01L 33/20* (2013.01); *H01L 33/22* (2013.01); *H01L 2224/48091* (2013.01); *H01L 2224/48463* (2013.01); *H01L 2224/49107* (2013.01)

(58) Field of Classification Search
USPC ........... 438/110, 22, 29, 458, 459, 62, 36, 41, 438/47; 257/98, 94, 103, E33.023, 257/E33.055, E33.06
See application file for complete search history.

(56) References Cited

U.S. PATENT DOCUMENTS

| | | | |
|---|---|---|---|
| 6,184,057 B1 * | 2/2001 | Van Andel et al. | 438/66 |
| 6,669,801 B2 * | 12/2003 | Yoshimura et al. | 156/230 |
| 7,190,001 B2 * | 3/2007 | Taki | 257/79 |
| 2003/0189215 A1 * | 10/2003 | Lee et al. | 257/94 |

(Continued)

FOREIGN PATENT DOCUMENTS

| | | |
|---|---|---|
| DE | 100 17 336 | 10/2001 |
| DE | 10 2004 030 603 | 2/2005 |

(Continued)

OTHER PUBLICATIONS

I. Schnitzer, "30% external quantum efficiency from surface textured, thin-film light-emitting diodes", Applied Physics Letter, vol. 63, No. 16, pp. 2174-2176, Oct. 18, 1993.

(Continued)

*Primary Examiner* — Khiem D Nguyen
*Assistant Examiner* — Wilner Jean Baptiste
(74) *Attorney, Agent, or Firm* — Cozen O'Connor

(57) ABSTRACT

An optoelectronic semiconductor chip (12) is disclosed comprising a thin-film semiconductor body (8), which comprises a semiconductor layer sequence (2, 20) having an active region (3) suitable for generating radiation, and comprising a carrier layer (7), which is formed on the semiconductor layer sequence and carries the thin-film semiconductor body.

11 Claims, 2 Drawing Sheets

(56) References Cited

U.S. PATENT DOCUMENTS

| | | | |
|---|---|---|---|
| 2004/0033638 A1* | 2/2004 | Bader et al. | 438/46 |
| 2004/0084682 A1* | 5/2004 | Illek et al. | 257/80 |
| 2004/0104390 A1 | 6/2004 | Sano et al. | |
| 2004/0169179 A1* | 9/2004 | Harle | 257/79 |
| 2004/0197981 A1 | 10/2004 | Hsieh et al. | |
| 2004/0256632 A1* | 12/2004 | Stein et al. | 257/103 |
| 2005/0017253 A1 | 1/2005 | Hata | |
| 2005/0127382 A1 | 6/2005 | Groetsch et al. | |
| 2005/0167239 A1 | 8/2005 | Tarlton | |
| 2005/0167725 A1* | 8/2005 | Nagano et al. | 257/309 |
| 2005/0176162 A1 | 8/2005 | Guo et al. | |
| 2005/0205875 A1 | 9/2005 | Shei et al. | |
| 2005/0208691 A1 | 9/2005 | Shei et al. | |
| 2005/0239279 A1* | 10/2005 | Park et al. | 438/618 |
| 2005/0253155 A1* | 11/2005 | Wirth | 257/88 |
| 2006/0043600 A1* | 3/2006 | Onodera et al. | 257/774 |
| 2006/0065905 A1* | 3/2006 | Eisert et al. | 257/95 |
| 2006/0099741 A1* | 5/2006 | Sorg et al. | 438/123 |
| 2006/0145164 A1 | 7/2006 | Illek et al. | |
| 2006/0180820 A1* | 8/2006 | Illek et al. | 257/95 |
| 2007/0029593 A1* | 2/2007 | Ramesh | 257/295 |

FOREIGN PATENT DOCUMENTS

| | | |
|---|---|---|
| EP | 0 356 037 | 8/1989 |
| EP | 0 434 233 | 11/1990 |
| EP | 1 536 466 | 6/2005 |
| JP | 2005-167239 | 6/2005 |
| JP | 2005-522873 | 7/2005 |
| JP | 2005-252222 | 9/2005 |
| WO | WO 03/088318 | 10/2003 |
| WO | WO 2005/004231 | 1/2005 |
| WO | WO 2005/022654 | 3/2005 |

OTHER PUBLICATIONS

Office Action issued on Nov. 18, 2011 in the corresponding Japanese Patent Application No. 2008-532579.

* cited by examiner

OPTOELECTRONIC SEMICONDUCTOR CHIP AND METHOD FOR PRODUCING IT

RELATED APPLICATIONS

This is a U.S. national stage of application No. PCT/DE2006/001549 under 35 USC 371, filed on 04 Sep. 2006.

This patent application claims the priority of German patent application nos. 10 2005 047 157.9 filed Sep. 30, 2005 and 10 2005 061 346.2 filed Dec. 21, 2005, the disclosure content of which is hereby incorporated by reference.

FIELD OF THE INVENTION

The invention relates to an optoelectronic semiconductor chip.

BACKGROUND OF THE INVENTION

In order to fix a prefabricated semiconductor body of the semiconductor chip on a separate carrier body prefabricated separately from the semiconductor body, complicated process steps for fixing the carrier body, for instance adhesive bonding or soldering of the carrier body onto the semiconductor body, are often required during the production of the chip.

SUMMARY OF THE INVENTION

It is an object of the present invention to specify an optoelectronic semiconductor chip which can be produced in a simplified manner and is efficient, in particular with regard to the coupling out of radiation.

This and other objects are attained in accordance with one aspect of the invention directed to an optoelectronic semiconductor chip according to the invention comprises a thin-film semiconductor body, which comprises a semiconductor layer sequence having an active region suitable for generating radiation, and comprises a carrier layer, which is formed on the semiconductor layer sequence and mechanically stabilizes the thin-film semiconductor body.

The carrier layer formed on the semiconductor layer sequence mechanically stabilizes the thin-film semiconductor body. A separate carrier body which is prefabricated separately and on which the semiconductor layer sequence for the thin-film semiconductor body is fixed, for example bonded, can thus be dispensed with. By forming, in particular shaping or stacking, the carrier layer on the semiconductor layer sequence for the thin-film semiconductor body, a complicated bonding process in which the separate carrier body is mechanically stably connected to the semiconductor layer sequence can be dispensed with. The production of the optoelectronic semiconductor chip is thus simplified by comparison with a semiconductor chip having a semiconductor layer sequence fixed on a separate carrier body. Since a fixing of the semiconductor layer sequence on a separate carrier body is dispensed with, the semiconductor chip can be manufactured correspondingly more cost-effectively.

In the context of the invention, a thin-film semiconductor body can be regarded as a semiconductor body which is freed from a production substrate on which the semiconductor layer sequence for the thin-film semiconductor body is produced, or in which the production substrate is thinned. In this case, the production substrate is preferably thinned or removed, in particular completely, in such a way that the mechanical stability of the semiconductor layer sequence is ensured, preferably essentially solely, by the carrier layer. A mechanical stabilization of the semiconductor layer sequence by the production substrate can advantageously be dispensed with on account of the carrier layer formed on the semiconductor layer sequence.

During the production of the semiconductor layer sequence by means of epitaxial growth, for example, the production substrate is provided by the growth substrate. The carrier layer of the thin-film semiconductor body is accordingly different in particular from the production substrate. A production substrate for a semiconductor layer sequence is generally subject to stringent requirements, for example with respect to the growth substrate's crystal face offered for the growth. Since the carrier layer of the thin-film semiconductor body is different from the production substrate, the carrier layer can be chosen comparatively freely without having to have the properties required for the production of the semiconductor layer sequence. A material for the carrier layer is expediently chosen in such a way that the carrier layer can be formed, in particular shaped or stacked, on the semiconductor layer sequence. By way of example, the carrier layer can be chosen comparatively freely with regard to optimized thermal conductivity. The efficiency of the semiconductor chip can thus be increased in a simplified manner on account of the improved thermal linking of the active region to an external heat-conducting element.

In a method according to an embodiment the invention for producing an optoelectronic semiconductor chip, the first step involves providing a semiconductor layer sequence arranged on a substrate for a semiconductor body of the semiconductor chip, wherein the semiconductor layer sequence has an active region suitable for generating radiation. A carrier layer is thereupon formed on the semiconductor layer sequence, whereupon the substrate is removed.

The substrate can comprise the production substrate of the semiconductor layer sequence or a substrate which is different from the production substrate. Instead of removing the substrate, for example by stripping it away, the substrate can, if appropriate, also just be thinned. However, the semiconductor layer sequence is advantageously supported essentially only by the carrier layer, such that dispensing with the carrier layer would greatly increase the risk of damage to the semiconductor layer sequence of the thin-film semiconductor body then formed, owing to a lack of mechanical support.

By way of example, etching, a laser separating method or water jet cutting is suitable for removing the substrate. Etching is particularly suitable for thinning the substrate.

Preferably, the substrate is essentially completely removed. Elements of the semiconductor layer sequence covered by the substrate become accessible for further processing in a simplified manner in this way.

Preferably, the carrier layer is formed on that side of the semiconductor layer sequence which is remote from the substrate. The removal or the thinning of the substrate is thus simplified.

The features described above and below can be used both for the optoelectronic semiconductor chip according to the invention and for the method according to the invention since the method is preferably used for producing a semiconductor chip according to the invention.

In a preferred configuration, the carrier layer is formed in self-supporting fashion. The carrier layer can therefore carry its own weight and the semiconductor layer sequence, and also, if appropriate, until the removal or thinning of the substrate, the weight of the substrate.

Preferably, the carrier layer has a thickness of greater than or equal to 10 µm, particularly preferably greater than or equal to 20 µm or greater than or equal to 50 µm. Furthermore, the carrier layer preferably has a thickness of less than or equal to 500 μm, particularly preferably less than or equal to 300 μm or less than or equal to 200 μm. A thickness of between and including 10 μm up to and including 500 μm, particularly preferably between and including 50 μm up to and including 200 μm or up to and including 300 μm, has proved to be particularly suitable for the carrier layer.

Such thicknesses are particularly suitable for the mechanical stabilization of the semiconductor layer sequence. Preferably, the thickness of the carrier layer is chosen to be as small as possible, such that although the semiconductor layer sequence is mechanically supported to a sufficient extent, the thickness of the carrier layer is not increased unnecessarily. A carrier layer having a comparatively small thickness may be distinguished by an advantageously low thermal resistance and accordingly by improved thermal linking to an external heat connection. Furthermore, differences in the coefficients of thermal expansion of the carrier layer relative to the semiconductor layer sequence are of less significance in the case of a comparatively small thickness. The risk of damage to the semiconductor layer sequence brought about on account of different coefficients of thermal expansion can thus be reduced. In this regard, a thickness of the carrier layer of between and including 50 μm up to and including 100 μm is also particularly suitable.

In a further preferred configuration, the carrier layer is mechanically stably connected to the semiconductor layer sequence. The carrier layer can already be formed with such a mechanically stable connection on the semiconductor layer sequence for the thin-film semiconductor body. A separate and additional connecting layer that imparts a mechanically stable connection between the carrier layer and the semiconductor layer sequence, for instance an adhesive layer, a bonding layer or a solder layer that is provided specially for forming a mechanically stable connection and preferably performs no additional function, for instance as a radiation-reflecting mirror layer, can advantageously be dispensed with.

In a further preferred configuration, the carrier layer is formed on the semiconductor layer sequence by means of a thin-film method. A thin-film method is generally provided for forming thin, non-self-supporting layers. In the context of the invention, the thin-film method is preferably provided for forming a carrier layer having a mechanical load-carrying capacity.

Preferably, the carrier layer is formed on the semiconductor layer sequence with a thickness that grows progressively over the duration of forming the carrier layer. What is suitable for this purpose is in particular a deposition method by means of which the carrier layer is preferably deposited on the semiconductor layer sequence. A deposition method is generally provided for forming thin, non-self-supporting layers. In the context of the invention, however, the deposition method is preferably used for forming a layer having a mechanical load-carrying capacity. The layer thickness of the carrier layer can be set by way of the deposition duration, wherein the layer thickness generally also increases as the deposition duration increases.

Preferably, the carrier layer is deposited on the semiconductor layer sequence by means of a PVD (PVD: physical vapor deposition) or CVD (CVD: chemical vapor deposition) method. Particularly preferably, the carrier layer is deposited on the semiconductor layer sequence by means of sputtering, in particular reactive sputtering, or a laser-assisted method, such as a deposition method using a pulsed laser, or vapor deposition. In contrast to sputtering, in which particles of the substance to be deposited are detached from a target often by means of ion bombardment, a laser, in particular a pulsed laser, is used in a laser-assisted method for detaching the particles. Furthermore, a plasma-assisted or plasma-enhanced PVD or CVD method, for instance a PECVD method (PECVD: plasma-enhanced chemical vapor deposition), may also be suitable for the deposition of the carrier layer.

In contrast to a galvanic method, which is only suitable for applying metal layers, nonmetallic layers can also be formed by means of the methods mentioned above. Preferably, the carrier layer is therefore embodied in nonmetallic fashion and is particularly preferably different from an electrodeposition layer.

The carrier layer can be embodied as a polycrystalline layer or as an amorphous layer. By way of example, the carrier layer can be formed as a ceramic layer. Preferably, the carrier layer contains an aluminum nitride, such as AlN, or an aluminum oxide, such as AlO or $Al_2O_3$. Materials of this type are particularly suitable for forming a carrier layer, in particular by means of sputtering. AlN is distinguished by a particularly high thermal conductivity.

In a further preferred configuration, the carrier layer is embodied in electrically insulating fashion, in particular as an insulator, and/or the carrier layer is embodied in absorbent fashion for the radiation generated in the active region.

The main emphasis when forming the carrier layer can thus be placed on the thermal and the mechanical load-carrying properties of the carrier layer in a simplified manner. Optical and/or electrical properties can essentially be disregarded. The carrier layer can comprise in particular a material that is electrically insulating and/or opaque to the radiation generated in the active region.

Furthermore, the carrier layer is preferably different from a quasi-substrate grown epitaxially, e.g. integrated monolithically into the semiconductor layer sequence, that is to say from a semiconductor layer grown up to a mechanically self-supporting thickness. The cost-intensive epitaxial time is thereby reduced and the production costs for the semiconductor chip can be kept within a tenable framework in a simplified manner.

In a further preferred configuration, the carrier layer has a multilayer structure. The degrees of freedom when forming the carrier layer are thus increased. By way of example, the coefficient of thermal expansion of a multilayer structure composite can be adapted to the coefficient of thermal expansion of the semiconductor layer sequence in a simplified manner on account of the increased variation possibilities afforded by a multilayer structure with regard to thickness and composition of the individual layers. The risk of thermally induced damage to the semiconductor layer sequence or the active region or of thermally induced stripping of the semiconductor layer sequence from the carrier layer can thus be reduced in a simplified manner. The multilayer structure preferably comprises a plurality of layers formed successively on the semiconductor layer sequence, for example two layers, which can in each case be formed in accordance with the above explanations concerning the carrier layer and can have different compositions, if appropriate.

In a further preferred configuration, a metal-containing layer, in particular a metal-based or alloy-based layer, is arranged between the carrier layer and the thin-film semiconductor body. The metal-containing layer is preferably applied to that side of the semiconductor layer sequence which is remote from the substrate, prior to forming the carrier layer.

Particularly preferably, the metal-containing layer is embodied as a metallic layer or an alloy layer. Suitable metals comprise for example Al, Ag, Au, Pt or an alloy, in particular with at least one of the metals mentioned above, for example AuGe or AuSn.

The metal-containing layer can be formed as a mirror layer for radiation generated in the active region. The risk of absorption of the radiation generated in the active region in the carrier layer is thus reduced. Furthermore, the radiation power coupled out from the semiconductor chip via that surface of the thin-film semiconductor body which is remote from the mirror layer can be increased by means of reflection at the mirror layer.

The metal-containing layer can furthermore be embodied as a contact layer for making electrical contact with the semiconductor chip, or be provided for this. In particular, the metal-containing layer can if appropriate simultaneously be formed as a contact layer and as a mirror layer. An external electrical connection of the semiconductor chip can thus be effected directly via the contact layer in a simplified manner. By way of example, the contact layer can be connected directly to a bonding wire. The provision of an additional connection layer can be dispensed with.

A thin-film semiconductor chip, that is to say a semiconductor chip comprising a thin-film semiconductor body arranged on the carrier layer, can furthermore be distinguished by at least one of the following features:

a reflective layer, e.g. the metal-containing mirror layer, is applied or formed at a main area of a radiation-generating epitaxial layer sequence that faces toward the carrier layer, said reflective layer reflecting at least part of the electromagnetic radiation generated in the epitaxial layer sequence back into the latter;

the epitaxial layer sequence has a thickness in the region of 20 μm or less, in particular in the region of 10 μm; and/or the epitaxial layer sequence contains at least one semiconductor layer with at least one area having an intermixing structure that ideally leads to an approximately ergodic distribution of the light in the epitaxial layer sequence, that is to say that it has an as far as possible ergodically stochastic scattering behavior.

A basic principle of a thin-film light-emitting diode chip is described for example in I. Schnitzer et al., "30% external quantum efficiency from surface textured thin film light emitting diodes", Appl. Phys. Lett. 63 (16), Oct. 18, 1993, 2174-2176, the disclosure content of which is hereby incorporated by reference.

A thin-film semiconductor chip comprising a mirror layer, e.g. the metal-containing layer, between the thin-film semiconductor body and the carrier layer emits radiation essentially via that surface of the thin-film semiconductor body which is remote from the carrier layer. A thin-film semiconductor chip of this type may have an emission characteristic corresponding to the cosinusoidal emission characteristic of a Lambertian surface emitter.

In a further preferred configuration, the semiconductor chip, in particular the semiconductor layer sequence or the active region, contains at least one III-V compound semiconductor material or the semiconductor chip, in particular the semiconductor layer sequence or the active region, is based on III-V compound semiconductor materials. Compound semiconductor materials, such as nitride compound semiconductors, phosphide compound semiconductors or arsenide compound semiconductors, are particularly suitable for the formation of a semiconductor layer sequence for efficient semiconductor chips, in particular for active regions having a high quantum efficiency.

In case of doubt, "based on nitride compound semiconductor material" means that at least one part of the semiconductor layer sequence comprises a nitride/V compound semiconductor material, preferably $Al_nGa_mIn_{1-n-m}N$, where $0 \leq n \leq 1$, $0 \leq m \leq 1$ and $n+m \leq 1$, preferably where $m \neq 0$ and/or $n \neq 0$. In this case, said material need not necessarily have a mathematically exact composition according to the above formula. Rather, it can have one or more dopants and additional constituents which essentially do not change the characteristic physical properties of the $Al_nGa_mIn_{1-n-m}N$ material. For the sake of simplicity, however, the above formula only comprises the essential constituents of the crystal lattice (Al, Ga, In, N), even if these can be replaced in part by small quantities of further substances.

In an equivalent manner, in the present case "based on phosphide compound semiconductor material" means in case of doubt that at least one part of the semiconductor layer sequence comprises a phosphide/V compound semiconductor material, preferably $Al_nGa_mIn_{1-n-m}P$, where $0 \leq n \leq 1$, $0 \leq m \leq 1$ and $n+m \leq 1$, preferably where $m \neq 0$ and/or $n \neq 0$. In this case, this material, too, need not necessarily have a mathematically exact composition according to the above formula. Rather, it can have one or more dopants and additional constituents which essentially do not change the characteristic physical properties of the $Al_nGa_mIn_{1-n-m}P$ material. For the sake of simplicity, however, the above formula only comprises the essential constituents of the crystal lattice (Al, Ga, In, P), even if these can be replaced in part by small quantities of further substances.

Likewise in an equivalent manner, in the present case "based on arsenide compound semiconductor material" means in case of doubt that at least one part of the semiconductor layer sequence comprises an arsenide/V compound semiconductor material, preferably $Al_nGa_mIn_{1-n-m}As$, where $0 \leq n \leq 1$, $0 \leq m \leq 1$ and $n+m \leq 1$, preferably where $m \neq 0$ and/or $n \neq 0$. This material, too, need not necessarily have a mathematically exact composition according to the above formula, and it can have one or more dopants and additional constituents which essentially do not change the characteristic physical properties of the $Al_nGa_mIn_{1-n-m}As$ material. For the sake of simplicity, however, the above formula in turn only comprises the essential constituents of the crystal lattice (Al, Ga, In, As), even if these can be replaced in part by small quantities of further substances.

Nitride compound semiconductor material is suitable particularly for an active region for generating ultraviolet to blue radiation, phosphide compound semiconductor material is suitable particularly for an active region for generating yellow to red radiation, and arsenide compound semiconductor material is suitable particularly for generating infrared radiation. The semiconductor chip is preferably formed for generating visible light.

In a further preferred configuration, the semiconductor chip is embodied as a resonator-free chip for generating incoherent radiation, e.g. as an LED chip. In contrast to chips comprising a resonator, for instance a laser, it is thus possible in a simplified manner essentially to use an entire surface of the semiconductor chip as an emission surface or to reduce the production outlay.

In a further preferred configuration, the method according to the invention is carried out for simultaneously producing a plurality of semiconductor chips in the wafer assembly or the method is suitable and preferably provided for being carried out in the wafer assembly.

For this purpose, preferably a semiconductor layer structure which is provided for the formation of a plurality of semiconductor bodies and which is arranged on a substrate is provided for the method according to the invention. Since a plurality of semiconductor chips can be produced in the wafer assembly, the production costs of an individual semiconductor chip can be reduced. A carrier layer formed on the semiconductor layer structure in accordance with the method can accordingly be used as a carrier layer for a semiconductor wafer whose semiconductor layer structure is provided for the formation of a plurality of semiconductor bodies.

A side face that delimits the carrier layer of a semiconductor chip produced by means of the method can be formed during the singulation of the semiconductor chip from the wafer assembly.

Furthermore, the carrier layer is preferably embodied as an outermost layer that does not reach around side areas of the semiconductor body. Furthermore, the carrier layer, in particular on its side remote from the semiconductor material and/or its side facing the semiconductor material, is preferably embodied in planar fashion.

DETAILED DESCRIPTION OF THE DRAWINGS

Elements which are identical, of identical type and act identically are provided with identical reference symbols in the figures.

FIG. 1 shows, on the basis of schematic sectional views in FIGS. 1A to 1F, intermediate steps for an exemplary embodiment of a method according to the invention for producing a plurality of optoelectronic semiconductor chips in the wafer assembly.

Figure 1A:
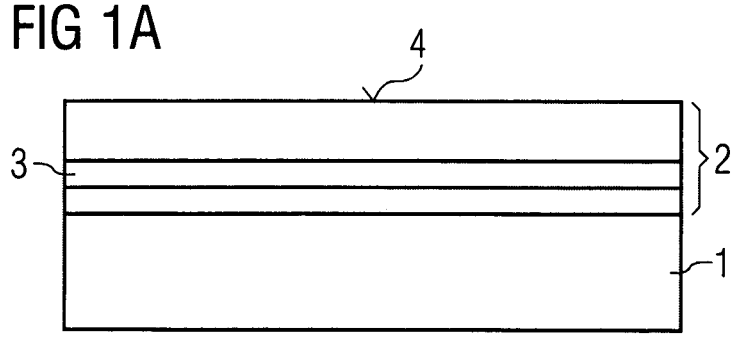
FIG. 1 shows, on the basis of schematic sectional views in FIGS. 1A to 1F, intermediate steps for an exemplary embodiment of a method according to the invention for producing a plurality of optoelectronic semiconductor chips in the wafer assembly.

Firstly, a semiconductor layer structure 2 arranged on a substrate 1, said semiconductor layer structure having an active region 3 suitable for generating radiation, is provided in the wafer assembly, FIG. 1A.

The substrate 1 contains GaAs, for example, and the semiconductor layer structure is preferably grown epitaxially on the substrate 1, such that the substrate 1 can form the growth substrate of the semiconductor layer structure. In this case, the active region 3 and/or the semiconductor layer structure 2 is based preferably on $Al_nGa_mIn_{1-n-m}P$, in particular where $m \neq 0$ and/or $n \neq 0$, and particularly preferably $Al_xGa_{1-x}As$, where $0 \leq x \leq 1$, preferably with $x > 0$. A GaAs substrate is particularly suitable for the growth of an active region or of a semiconductor layer structure based on InGaAlP, which can also additionally contain elements based on AlGaAs.

The active region 3 preferably comprises a double heterostructure, or a single or multiple quantum well structure. Structures of this type are particularly suitable for efficiently generating radiation on account of the high internal quantum efficiencies that can be obtained. The designation quantum well structure does not comprise any indication about the dimensionality. It therefore encompasses, inter alia, quantum wells, quantum wires and quantum dots and any combination of these structures.

Figure 1B:
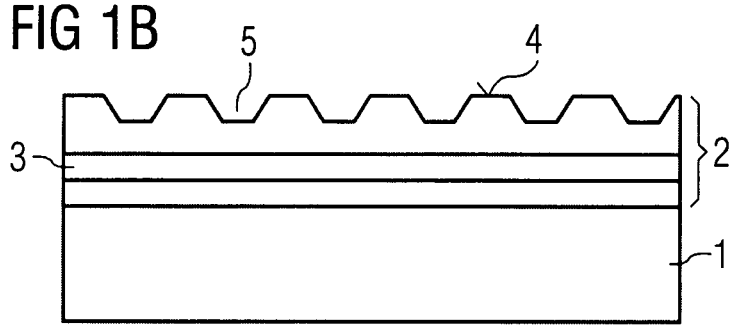

The surface 4 of the semiconductor layer structure 2 that is remote from the substrate 1 is subsequently provided with a surface structure 5, FIG. 1B. Said structure can be formed in a, for example p-conducting, semiconductor layer that delimits the semiconductor layer structure 2 preferably on the side remote from the substrate 1. The surface structure 5 can be produced by means of etching, for example wet- or dry-chemical etching, using a suitably formed mask in the semiconductor layer structure 2. This is preferably done by forming a mask on the surface 4 which is cut out in accordance with the desired surface structure. The surface structure can thereupon be produced through the cutouts of the mask and the mask can subsequently be removed again.

If appropriate, the surface structure can also be produced from roughening, for example by means of a sandblasting method. In this case, preferably the entire surface is subjected to a roughening. A mask for the definition of the structure can be dispensed with in this case.

The surface structure 5 can comprise for example a plurality of, preferably equidistantly arranged, depressions, for example in the form of truncated pyramids, truncated cones or microprisms. A depression widens in the lateral direction preferably with increasing distance from the active region, in particular parallel to the active region.

By means of the surface structure 5, in the semiconductor chip to be produced it is possible to obtain, in a simplified manner, a reflection of radiation on the part of the structured surface with a broad distribution of the reflection angles. The probability of a continued total reflection of radiation generated in the active region 3 in the semiconductor material is reduced on account of the surface structure, whereby the coupling-out efficiency of radiation from the semiconductor material of the semiconductor chips produced has increased.

Figure 1C:
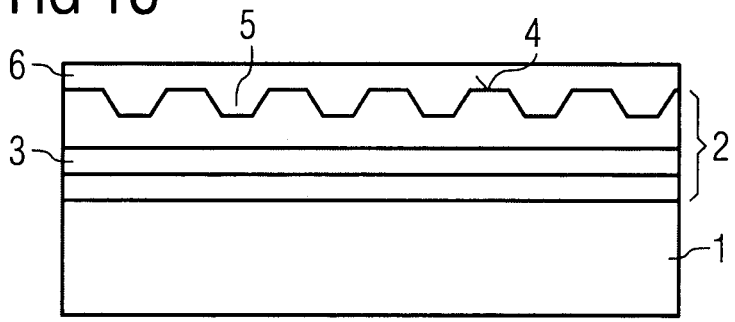

A metal-containing layer 6 is thereupon applied, for example by vapor deposition, to that side of the assembly which is remote from the substrate 1 (FIG. 1C). The metal-containing layer 6 is preferably embodied as a metallization, for example composed of Au, or an alloy, for example composed of AuGe. The metal-containing layer 6 is furthermore preferably electrically conductively connected to the active region 3 at least in some regions, preferably essentially over the whole area, and can thus be used in a simplified manner as a contact layer by means of which electrical contact can be made with the semiconductor chips to be produced. In particular, the metal-containing layer can be applied directly to the semiconductor material. Furthermore, the metal-containing layer 6 can be embodied as a mirror layer that reflects radiation generated in the active region back into the semiconductor material. Furthermore, the metal-containing layer preferably projects into the surface structure.

If appropriate, the metal-containing layer 6 can also be embodied as a plurality of layers of which one part forms the contact layer and a further part forms the mirror layer (not illustrated). In this case, the individual layers can be embodied, in a simplified manner, in a fashion optimized with regard to a function in electrical contact-making and respectively for the reflection of radiation.

If appropriate, an electrical insulation layer, containing for example a silicon nitride, such as SiN, can also be arranged between the metal-containing layer 6 and the semiconductor material (not illustrated). Said insulation layer can serve as a dielectric mirror layer. The insulation layer is preferably cut out in contact locations for an electrically conductive connection of the metal-containing layer 6 to the active region.

The metal-containing layer 6 preferably has so large a thickness that that surface of the metal-containing layer which is remote from the active region 3 is essentially planar. The surface structure 5 can accordingly be filled by means of the metal-containing layer in such a way that a planar area is formed on that side of the metal-containing layer which is remote from the surface structure 5.

Figure 1D:
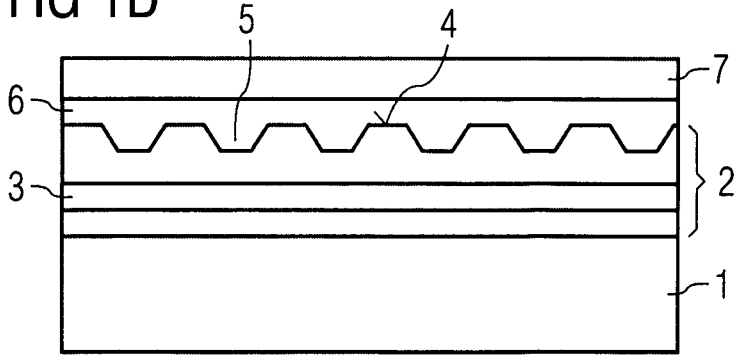

A carrier layer 7 is subsequently deposited on the metal-containing layer 6, FIG. 1D.

The carrier layer 7 can be formed by means of sputtering on the assembly. For this purpose, an aluminum nitride, such as AlN, or an aluminum oxide, such as AlO or $Al_2O_3$, is particularly suitable as material for the carrier layer. The carrier layer 7 can furthermore be embodied in particular as an amorphous or polycrystalline layer, e.g. as a ceramic layer. Aluminum oxide and in particular aluminum nitride are distinguished by advantageously high thermal conductivities, such that the heat arising during the generation of radiation can be conducted away from the semiconductor material in a simplified manner. If appropriate, the sputtering can be effected in reactive and/or laser-assisted fashion. Aluminum nitride, for example, is an electrical insulator, such that electrical contact is made with the active region 3 preferably by means of the metal-containing layer 6.

The carrier layer 7 is formed in self-supporting fashion and in particular preferably in planar fashion essentially on both sides, such that it carries its own weight and mechanically stabilizes the semiconductor layer structure 2. For this purpose, a thickness of the carrier layer of between and including 50 µm up to and including 200 µm, in particular between and including 50 µm up to and including 100 µm, is particularly suitable also with regard to a good heat dissipation from the active region. Since the metal-containing layer can be embodied as a mirror layer, the carrier layer 7 can if appropriate also be embodied in absorbent fashion for the radiation to be generated, without significantly increasing the risk of actual absorption of radiation in the carrier layer 7. The carrier layer can therefore be embodied in radiation-opaque fashion, in particular from a radiation-opaque material or a corresponding material composition.

Depending on the material of the carrier layer, besides sputtering other deposition methods, such as a CVD or PVD method, for example vapor deposition, can also be used for the process of forming, in particular stacking, the carrier layer. Methods which are suitable for forming an amorphous or polycrystalline layer, in particular a ceramic layer, are preferably used. A plasma-assisted deposition method, for instance a PECVD method, can also be suitable for applying the carrier layer.

Furthermore, a multilayer structure, preferably having individual layers of different compositions, e.g. an aluminum nitride layer and an aluminum oxide layer, can also serve as carrier layer 7, whereby the degrees of freedom in the configuration of the carrier layer 7, in particular the adaptation of the coefficient of thermal expansion of the carrier layer to that of the semiconductor layer structure, are increased. As the number of layers increases, however, the thermal resistance of the carrier layer generally also increases, such that a smallest possible number of individual layers, e.g. five or fewer, is preferred. The carrier layer particularly preferably comprises precisely one individual layer.

Since the carrier layer 7 is formed on the active region 3 or, in particular directly, on the metal-containing layer 6, a bonding process, for example a soldering or adhesive bonding of a carrier body prefabricated separately outside the wafer assembly onto the semiconductor layer structure 2, can be dispensed with and the production method can consequently be simplified.

Figure 1E:
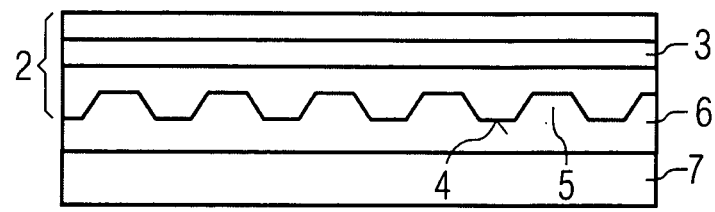

In a method step carried out subsequently, FIG. 1E, the substrate 1 is removed from the semiconductor layer structure 2. By way of example, the substrate 1 is etched away or stripped away, for instance by means of a laser separating method.

The mechanical stability of the wafer assembly with the semiconductor layer structure 2 arranged on the carrier layer 7 is ensured, in particular solely, by the self-supporting carrier layer.

The semiconductor layer structure 2 is subsequently patterned in such a way as to form a plurality of semiconductor bodies 8 which are arranged on the carrier layer 7 and which are preferably spaced apart from one another in each case by an interspace 9. The semiconductor bodies 8 which emerge from the semiconductor layer structure 2 after the patterning thereof each have a semiconductor layer sequence 20 having an active region 3 suitable for generating radiation. Said patterning can be effected by means of etching using a suitable mask, which is subsequently removed again.

Preferably, patterning is effected from that side of the assembly which is remote from the carrier layer 7, in such a way that the metal-containing layer 6 is uncovered. Since the growth substrate has been removed from the semiconductor layer structure 2, the semiconductor bodies 8 are embodied as thin-film semiconductor bodies.

Optoelectronic semiconductor chips 12 can subsequently be singulated from the wafer assembly along the lines 10 running in the region of the interspaces 9. The singulation can be effected for example by sawing in the region of the interspaces. The optoelectronic semiconductor chips preferably each comprise precisely one semiconductor body 8. The singulation is effected in particular through the carrier layer 7 and/or the metal-containing layer 6.

Prior to singulation, electrical contacts 11 are applied, for example by vapor deposition, to the assembly for the semiconductor bodies 8 on the side remote from the carrier layer 7. The contacts 11 are preferably embodied as contact metallizations.

Figure 1F:
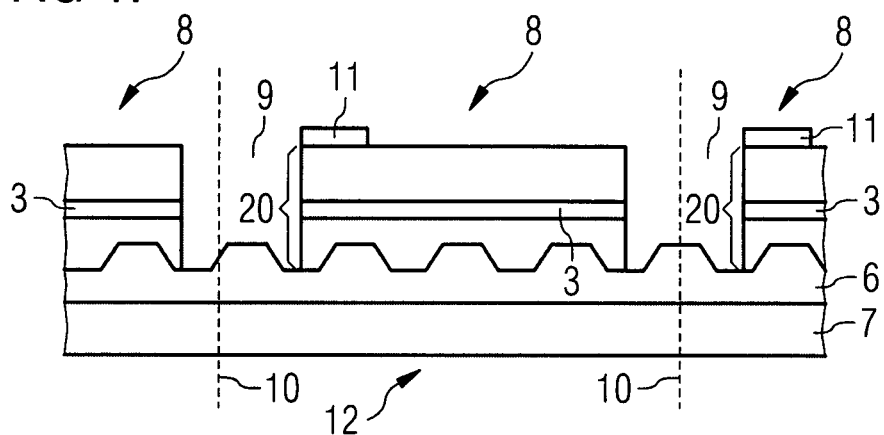
Figure 2:
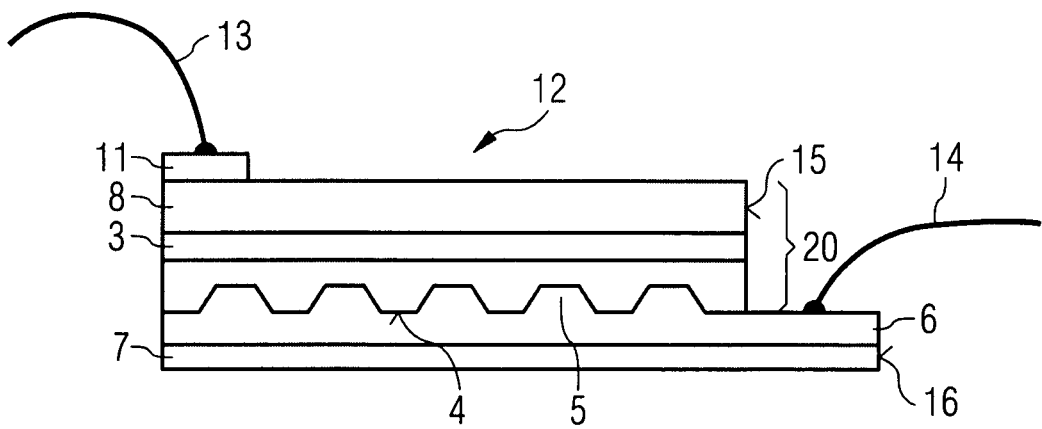
FIG. 2 shows a schematic sectional view of an exemplary embodiment of an optoelectronic semiconductor chip according to the invention.

FIG. 2 shows an optoelectronic semiconductor chip 12 that can be produced in accordance with the method described in FIG. 1. The semiconductor chip 12 essentially corresponds to a semiconductor chip which has a thin-film semiconductor body 8 and which emerges by singulation from the assembly shown in FIG. 1F, such that the features described in association with FIG. 1 can also be used for the semiconductor chip in accordance with FIG. 2.

In contrast to the assembly in FIG. 1F, the contact 11 for the electrical contact-connection of the semiconductor chip, for example with the connecting conductors of a housing into which the semiconductor chip 12 is inserted, is electrically conductively connected to a bonding wire 13. The metal-containing layer 6 is electrically conductively connected, in particular directly, to a further bonding wire 14. The optoelectronic semiconductor chip 11 can be electrically connected via the contact 11 and the metal-containing layer 6 serving as a contact layer. For this purpose, the metal-containing layer 6 and/or the contact 11 is electrically conductively connected to the active region 3. In order to facilitate the electrical contact-connection of the metal-containing layer 6, for instance by means of the bonding wire 14, the metal-containing layer 6 preferably projects laterally beyond a side face 15 delimiting the semiconductor body 8. Preferably, the carrier layer also projects beyond the side area 15. The metal-containing layer 6 is therefore advantageously mechanically stabilized by the carrier layer 7 in the laterally projecting region as well.

Furthermore, a side face 16 laterally delimiting the semiconductor chip 12 can be formed during singulation. Said side face is preferably formed at least partly by the carrier layer 7 and/or the metal-containing layer 6. Furthermore, the side face 16 is spaced apart laterally from the semiconductor body 8, in particular the side area 15 thereof.

The metal-containing layer 6 reflects radiation generated in the active region during the operation of the semiconductor chip 12. On account of the surface structure 5, the reflection angles are advantageously widely spread in the case of reflection at the metal-containing layer in comparison with reflection at a planar surface, whereby the risk of continued total reflection of radiation in the semiconductor body 8 and correspondingly reduced coupling-out of radiation from the semiconductor body 8 is reduced. The coupling-out efficiency of the semiconductor chip is consequently increased.

Furthermore, the semiconductor chip 12 is preferably formed as a resonator-free LED chip for generating incoherent radiation. A chip of this type can be produced particularly simply and cost-effectively.

Via the carrier layer 7, e.g. composed of AlN, which is preferably electrically insulating but has good thermal conductivity, heat arising in the active region 3 during operation of the semiconductor chip 12 can be reliably dissipated from the semiconductor material.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A method for producing an optoelectronic semiconductor chip comprising the steps of:
   providing a semiconductor layer sequence arranged on a substrate for a semiconductor body of the semiconductor chip, wherein the semiconductor layer sequence has an active region suitable for generating radiation;
   forming a carrier layer on the semiconductor layer sequence; and
   removing the substrate,
   wherein the carrier layer is electrically insulating, and
   wherein the carrier layer is deposited on the semiconductor layer sequence by means of a deposition method.

2. The method as claimed in claim 1,
   wherein
   the carrier layer is formed on that side of the semiconductor layer sequence which is remote from the substrate.

3. The method as claimed in claim 1,
   wherein
   the carrier layer is formed on the semiconductor layer sequence by means of a thin-film method.

4. The method as claimed in claim 1,
   wherein
   the carrier layer is deposited on the semiconductor layer sequence by means of a PVD method or a CVD method.

5. The method as claimed in claim 1,
   wherein the carrier layer is deposited on the semiconductor layer sequence by means of a sputtering, by means of a laser-assisted method, or by means of a vapor deposition.

6. The method as claimed in claim 1,
   wherein
   a metal-containing layer, in particular a metal- or alloy-based layer, is applied to that side of the semiconductor layer sequence which is remote from the substrate, prior to forming the carrier layer.

7. The method as claimed in claim 1,
   wherein
   the substrate comprises a growth substrate on which the semiconductor layer sequence is grown epitaxially.

8. The method as claimed in claim 1,
   wherein
   the method is carried out for simultaneously producing a plurality of semiconductor chips in the wafer assembly.

9. The method as claimed in claim 8,
   wherein
   a side face that delimits the carrier layer of a semiconductor chip produced by means of the method is formed during a singulation of the semiconductor chip from the wafer assembly.

10. The method as claimed in claim 1, wherein the carrier layer is deposited on the semiconductor layer sequence by means of a reactive sputtering or by means of a deposition method using a pulsed laser.

11. A method for producing an optoelectronic semiconductor chip comprising the steps of:
    providing a semiconductor layer sequence arranged on a substrate for a semiconductor body of the semiconductor chip, wherein the semiconductor layer sequence has an active region suitable for generating radiation;
    forming a carrier layer on the semiconductor layer sequence; and
    removing the substrate,
    wherein the carrier layer is electrically insulating, and
    wherein the carrier layer is formed on the semiconductor layer sequence with a thickness that grows progressively during the forming of the carrier layer.

* * * * *